United States Patent [19]
Manning

[11] Patent Number: 6,002,617
[45] Date of Patent: *Dec. 14, 1999

[54] FAST POWER UP REFERENCE VOLTAGE CIRCUIT AND METHOD

[75] Inventor: Troy A. Manning, Meridian, Id.

[73] Assignee: Micron Technology, Inc., Boise, Id.

[*] Notice: This patent is subject to a terminal disclaimer.

[21] Appl. No.: 09/244,917

[22] Filed: Feb. 10, 1999

Related U.S. Application Data

[63] Continuation of application No. 08/910,969, Aug. 7, 1997, Pat. No. 5,898,625.

[51] Int. Cl.[6] ................................................. G11C 16/04
[52] U.S. Cl. .................... 365/189.09; 365/205; 365/207; 327/538
[58] Field of Search ........................... 365/189.09, 205, 365/207; 327/538

[56] References Cited

U.S. PATENT DOCUMENTS

| | | |
|---|---|---|
| 5,479,374 | 12/1995 | Kobayashi et al. .................. 365/233.5 |
| 5,490,111 | 2/1996 | Sakata ................................. 365/189.01 |
| 5,615,169 | 3/1997 | Leung ................................... 365/233.5 |
| 5,682,353 | 10/1997 | Eitan et al. ............................. 365/233 |

Primary Examiner—David Nelms
Assistant Examiner—Hoai V. Hu
Attorney, Agent, or Firm—Dorsey & Whitney LLP

[57] ABSTRACT

A reference voltage circuit includes a self-decoupling boost circuit coupled between a supply voltage and an output node. The boost circuit provides a boost current to accelerate the transition of the output node's voltage. The boost circuit is controlled by a voltage detection circuit having its input coupled to the output node of the reference voltage circuit. The voltage detection circuit monitors the output voltage of the reference voltage circuit and provides a disable disable to disable the boost signal when the output voltage approaches its final value. Thus, the boost circuit provides a temporary boost current until the output voltage reaches its desired value.

22 Claims, 5 Drawing Sheets

FAST POWER UP REFERENCE VOLTAGE CIRCUIT AND METHOD

CROSS-REFERENCE TO RELATED APPLICATION

This application is a continuation of U.S. patent application No. 08/910,969, filed Aug. 7, 1997 now U.S. Pat. No. 5,898,625.

TECHNICAL FIELD

The present invention relates to integrated circuit devices, and more particularly, to power up circuits for integrated devices.

BACKGROUND OF THE INVENTION

Many circuits within integrated memory devices require a reference voltage for proper operation. For example, reference voltages are used in some memory devices which employ boosting amplifiers to compensate for losses in column select circuits that reduce line voltages from sense amplifiers. FIG. 1 shows boosting amplifiers 20 which are differential amplifiers that receive data D, D* from sense amplifiers on a pair of data lines 22 and output boosted data DX, DX* on a pair of output data lines 24. The boosting amplifiers 20 also include equilibration transistors 26 controlled by an equilibrate signal LEQ to reset the differential amplifiers and equilibrate the output data lines 24.

The responses of the boosting amplifiers 20 are controlled by respective current control transistors 30 that establish the maximum current I available to the boosting amplifiers 20, responsive to a reference voltage DCREF. When the sense amplifiers are inactive, the reference voltage DCREF is pulled low to disable the boosting amplifiers 20 and conserve power. To prepare for a data read operation, the reference voltage DCREF is pulled above the threshold voltage $V_\tau$ of the control transistors 30 to turn ON the control transistors 30. In response, the control transistors 30 establish the current I, thereby enabling the boosting amplifiers 20.

For example, if the data D, D* are high and low. respectively, they turn ON transistors 32, 34 and turn OFF transistors 31, 33. The ON transistors 32, 34 pull voltages $V_B$, $V_D$ low at respective nodes B, D, inducing currents $I_{36}$, $I_{38}$ through respective diode-coupled PMOS transistors 36, 38. The induced currents $I_{36}$, $I_{38}$ establish gate voltages of the PMOS transistors 36, 38 and thus turn ON PMOS transistors 35, 37 to couple nodes A, C to the supply voltage Vcc. At the same time. the OFF transistors 31, 33 isolate respective nodes A, C from ground, so the voltages $V_A$, $V_C$ at the nodes A, C rise to the supply voltage $V_{CC}$. The nodes A, D drive the boosted data lines 24, such that the boosted data DX, DX* will be high and low, respectively.

For high speed operation, it is desirable to establish the reference voltage DCREF very quickly. FIG. 2 shows one prior art approach for providing the reference voltage DCREF. in which a reference voltage circuit 40 is formed from an inverter 42, a reset transistor 44, and a biasing leg 46. The reset transistor 44 is an NMOS transistor coupled between an output node 52 and ground with its gate controlled by the inverter 42. The biasing leg 46 is formed from a PMOS activation transistor 48, a PMOS dropping transistor 50 and a reference transistor 54 serially coupled between a supply voltage $V_{CC}$ and ground. The gate of the activation transistor 48 is controlled by the inverter 42 and the gates of the dropping and reference transistors 50, 54 are controlled by the output node 52.

The reference voltage circuit 40 is activated by an enable signal DCSA_EN at the inverter input to initiate generation of the reference voltage DCREF. In response to the high enable signal DCSA_EN, the inverter 42 outputs a low inverted enable signal DCSA_EN* that turns OFF the reset transistor 44. Additionally, the low inverted enable signal DCSA_EN* turns ON the activation transistor 48 to couple the supply voltage $V_{CC}$ to the dropping transistor 50. The dropping transistor 50 turns ON, because its source voltage (approximately $V_{CC}$) is higher than its sate and drain voltage (approximately ground) because the reset transistor 44 was ON before DCSA_EN* transitioned low. The ON dropping transistor 50 thus begins raising the voltage $V_{NODE}$ of the output node 52 toward the reference voltage DCREF. As the output node voltage $V_{NODE}$ rises, the gate-to-source voltage $V_{GS}$ of the reference transistor 54 rises above its threshold voltage $V_\tau$ and the reference transistor 54 turns ON. With all three transistors 48, 50, 54 ON the series combination of the transistors 48, 50, 54 will establish the reference voltage DCREF at a stable level determined by the channel resistances of the individual transistors 48, 50, 54.

When the enable signal DCSA_EN returns low, the inverted enable signal DCSA_EN* goes high, thereby turning OFF the activation transistor 48 and turning ON the reset transistor 44. The OFF activation transistor 48 isolates the output node 52 from the supply voltage $V_{CC}$ and the ON reset transistor 44 quickly pulls the output node 52 low preparing the reference voltage circuit 40 for the next high going transition of DCSA_EN.

The above-described response of the reference voltage circuit 40 to DCSA_EN going high will not be instantaneous, due to loading of the output node 52. As represented by a load circuit 56, circuits being driven by the reference voltage circuit 40 (e.g., the current control transistors 30 of FIG. 1 and the corresponding signal lines) load the reference voltage circuit 40. Such loading is primarily capacitive, so the load circuit 56 can be modeled adequately with a capacitor 58, as shown in FIG. 2.

The capacitance C of the load circuit 56 combined with the channel resistances of the transistors 48, 50, 54 forms an RC circuit such that the capacitor 58 charges exponentially to the reference voltage DCREF. Consequently, when the inverter 42 turns ON the upper PMOS transistor 48, the output node voltage $V_{NODE}$ rises toward the reference voltage DCREF at a rate determined by the RC time constant of the channel resistances and the capacitance C. The resulting delay in development of the reference voltage DCREF at the output node 52 slows operation of integrated device.

To improve the response time of the reference voltage circuit 40, another prior art reference voltage circuit 60 shown in FIG. 3 adds a timed boost circuit 62 to the reference voltage circuit 40 to provide a current boost to the output node 52 over a fixed period following transitions of the enable signal DCSA_EN. The boost circuit 62 is formed from a pulse circuit 64 that drives a PMOS boost transistor 66 coupled between a supply voltage $V_{CC}$ and the output node 52. The pulse circuit 64 typically is formed from a NAND gate having one input driven by a re-inverted version of the inverted enable signal DCSA_EN* and a second input driven by a delayed version of the inverted enable signal DCSA_EN*. However, a variety of other circuit structures for the pulse circuit 64 will be apparent to one skilled in the art.

When the enable signal DCSA_EN goes high and the inverted signal DCSA_EN* goes low, the biasing leg 46 operates as described above. At the same time, the low-going inverted signal DCSA_EN* activates the pulse circuit 64, thereby causing the pulse circuit 64 to output a low going pulse $V_P$. The low-going pulse $V_P$ turns ON the boost transistor 66 for a fixed period τ to temporarily couple the supply voltage $V_{CC}$ to the output node 52. A boost current $I_{BOOST}$ flows through the ON boost transistor 66 to help charge the capacitor 58. Because the capacitor 58 is charged by both the boost current $I_{BOOST}$ and the current through the PMOS transistors 48, 50, the output node voltage $V_{NODE}$ rises more quickly to the reference voltage DCREF than in the circuit 40 of FIG. 2.

While the reference voltage circuit 60 of FIG. 3 provides an improved response time as compared to the reference voltage circuit 40 of FIG. 2, the circuit 60 does not always provide acceptable results, primarily because the duration of the current boost is fixed and unresponsive to the actual voltage of the output node 52. Consequently, it can be difficult to achieve proper timing of the boost signal to optimize the response. If the pulse $V_P$ is too long, the output node voltage $V_{NODE}$ may overshoot the desired reference voltage DCREF. Then, when the boost transistor 66 turns OFF, the biasing circuit 46 will require additional time to reduce the output node voltage $V_{NODE}$ to the reference voltage DCREF. If the pulse $V_P$ is too short, the boost current $I_{BOOST}$ will stop before the output node voltage $V_{NODE}$ reaches the reference voltage DCREF and the response of the circuit 60 will not be as fast as desired.

Establishing the proper pulse duration becomes even more problematic where the device includes more than one reference voltage circuit 60 or more than one boost amplifier 20. Such devices may be located at differing distances from the circuit 60. Consequently, the capacitance C presented to the reference voltage circuit 60 will vary according to the different lengths of signal lines between the reference voltage circuit 60 and the boost amplifiers 66. Consequently, the optimum duration τ of the pulse $V_P$ may depend upon the specific layout of the integrated device. Because the reference voltage circuit 60 of FIG. 3 uses a fixed time delay, the circuit 60 does not compensate for differences in capacitance C.

SUMMARY OF THE INVENTION

A voltage driver circuit for producing a selected output voltage in response to an input signal includes a primary voltage circuit that establishes the selected output voltage. Additionally, the voltage driver circuit includes a boost circuit driven by an output voltage detection circuit. The boost circuit provides a boost current to boost the output voltage until the detection circuit indicates that the output voltage is at, or near, the selected output voltage. The boost circuit thus accelerates the rise of the output voltage toward the selected voltage. The detection circuit controls timing of the boost signal such that the boost signal is only provided during the time that the output voltage is at or below the selected voltage.

In one embodiment the boost circuit is formed from a switch coupled between a supply voltage and the output node, where the switch is controlled by a boost enable signal from the detection circuit. The detection circuit is formed from a CMOS inverter coupled between a supply voltage and ground and biased with a current limiting transistor. The input to the inverter is controlled by the output voltage and the boost enable signal is taken from an inverter output. When the output voltage is below the selected voltage, the inverter outputs a high boost signal, thereby turning ON the boost switch to provide the boost current. When the output voltage approaches the selected voltage, the inverter outputs a low boost signal, thereby turning OFF the boost switch to terminate the boost current.

DETAILED DESCRIPTION OF THE INVENTION

Figure 1:
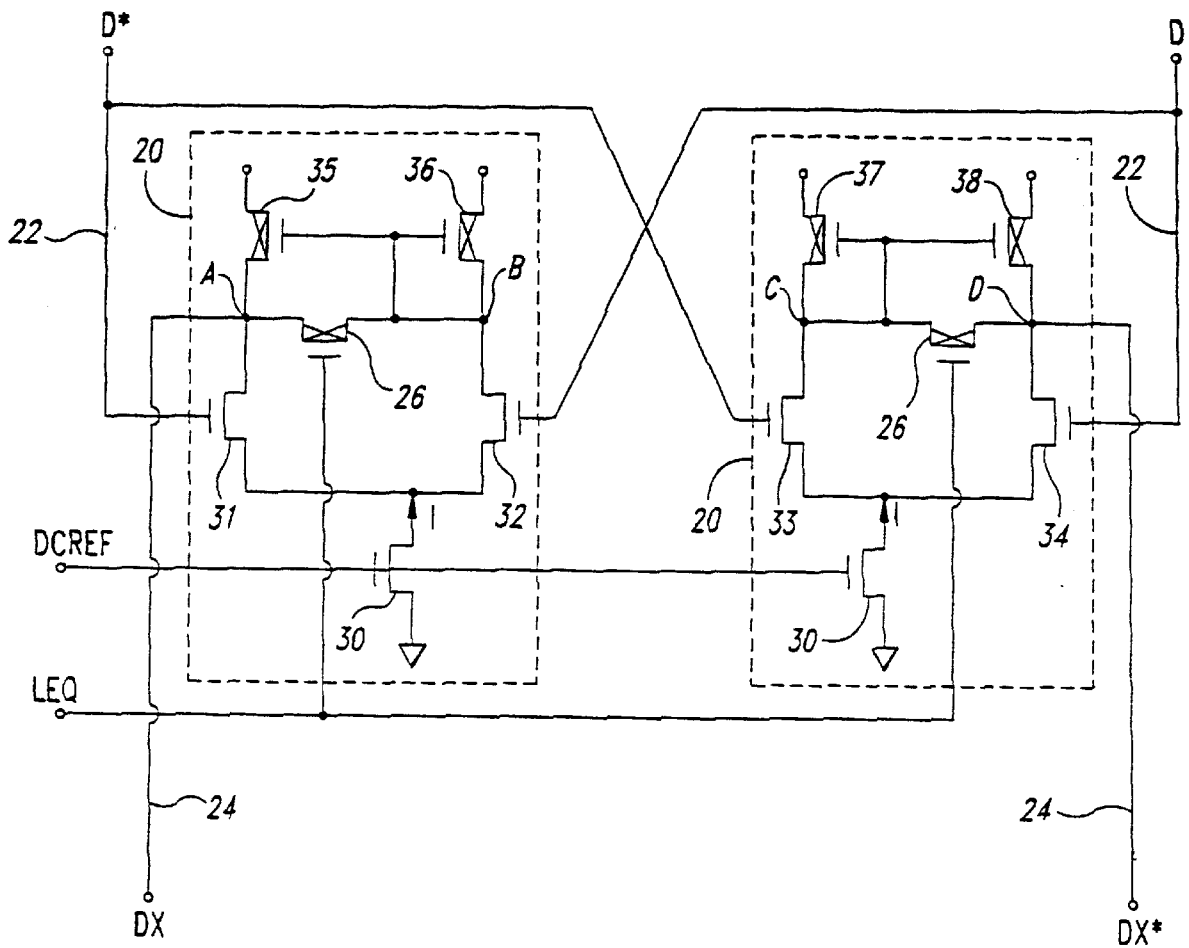
FIG. 1 is a schematic of a conventional pair of boosting amplifiers coupled between respective data lines.
Figure 2:
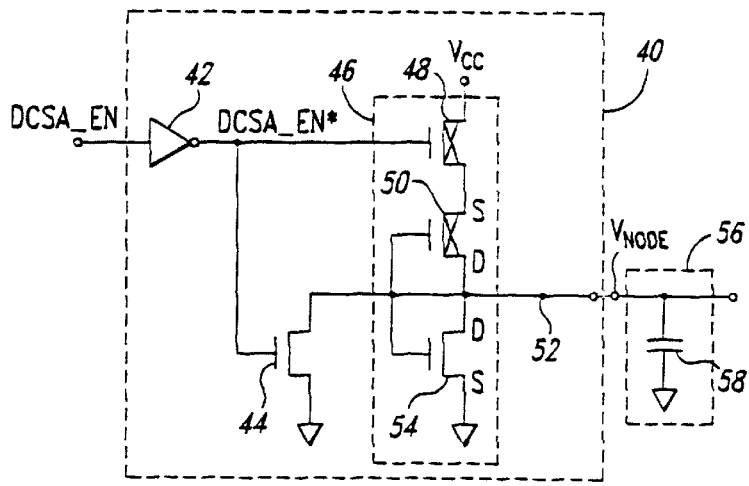
FIG. 2 is a schematic of a prior art reference voltage circuit.
Figure 3:
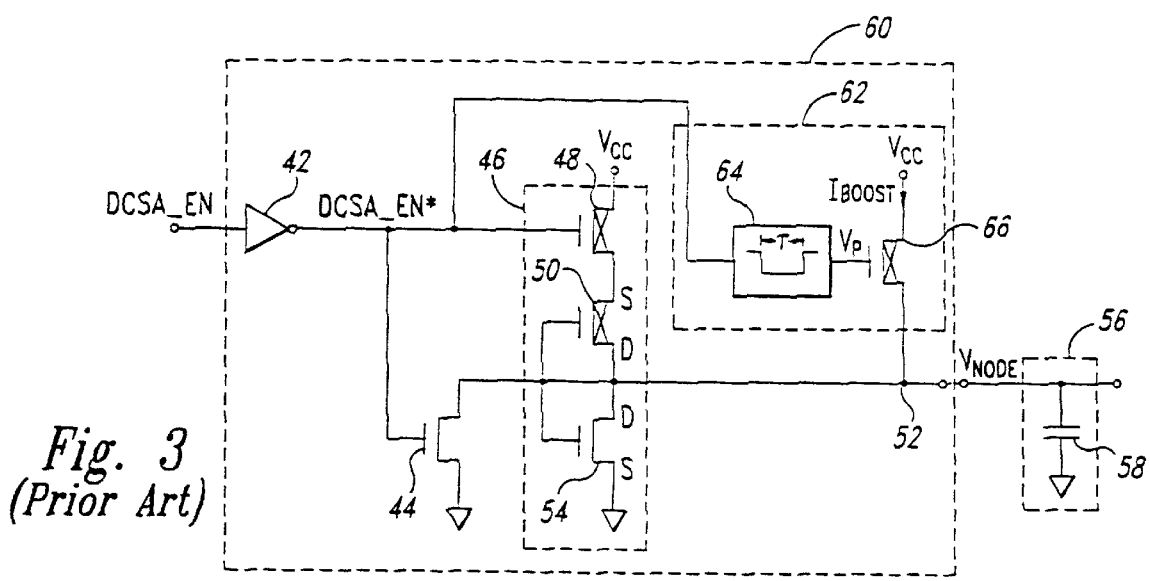
FIG. 3 is a schematic of a prior art reference voltage circuit including a timed boost circuit.
Figure 4:
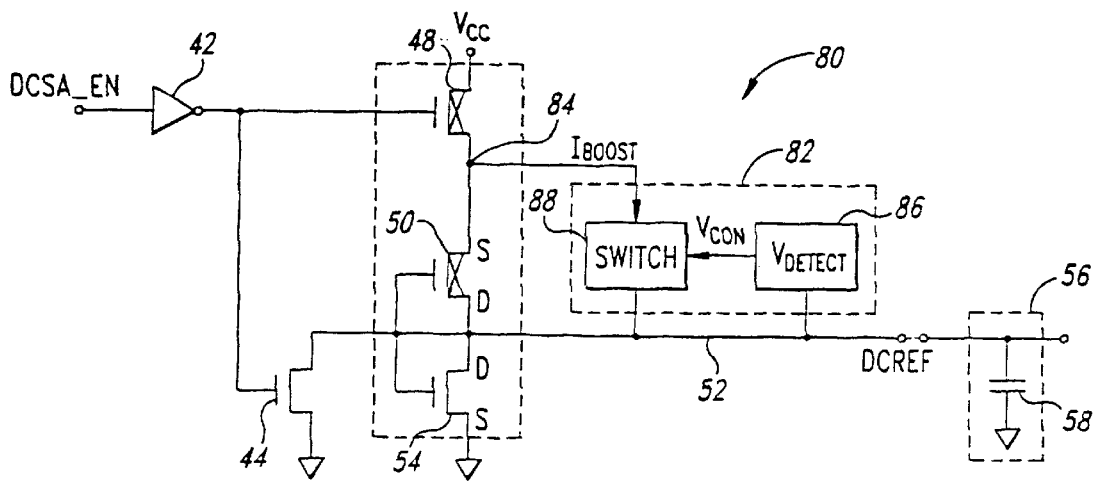
FIG. 4 is a partial block diagram and partial schematic of a reference voltage circuit according to a preferred embodiment of the invention where the boost circuit includes a voltage detection circuit.

FIG. 4 shows a reference voltage circuit 80 according to one embodiment of the invention that includes several of the same components as FIGS. 1 and 2, where analogous components are numbered identically. Like the reference voltage circuit 60 of FIG. 3, the reference voltage circuit 80 includes a boost circuit 82. However, the structure and operation of the boost circuit 82 differ from those of the boost circuit 62 of FIG. 4.

The boost circuit 82 is formed from a voltage detection circuit 86 having its input coupled to the output node 52 and a switch 88 coupled between the output node 52 and a supply node 84 formed at the interconnection of the PMOS transistors 48, 50. As will be explained in greater detail below, the output of the voltage detection circuit 86 is a control voltage $V_{CON}$ that controls operation of the switch 88. When the output voltage $V_{NODE}$ is below the desired reference voltage DCREF, the control voltage $V_{CON}$ is high, turning ON the switch 88 to directly couple the supply node 84 to the output node 52. When the output voltage $V_{NODE}$ approaches the reference voltage DCREF, the control voltage $V_{CON}$ transitions low, turning OFF the switch 88 to isolate the output node 52 from the supply node 84. The boost circuit 82 thus temporarily provides a boost current $I_{BOOST}$ directly to the output node 52 from the supply node 84 until the capacitor voltage $V_C$ reaches approximately the reference voltage DCREF. At that point, the boost circuit 82 turns OFF and the output voltage $V_{NODE}$ is controlled by the ON transistors 48, 50, 54.

Figure 5:
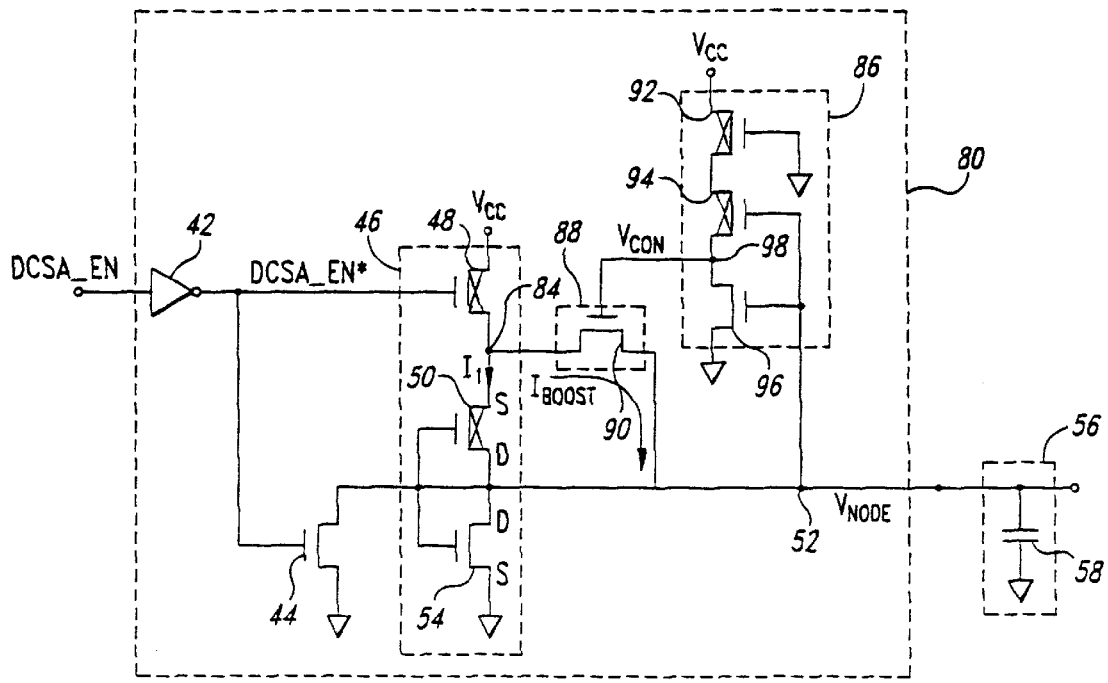
FIG. 5 is a schematic showing one circuit realization of the reference voltage circuit of FIG. 4.

FIG. 5 shows one realization of the reference voltage circuit 80 in which the switch 88 is formed from an NMOS boost transistor 90 and the voltage detection circuit 86 is formed from three transistors 92, 94, 96 coupled between the supply voltage $V_{CC}$ and ground. The uppermost transistor 92 is a PMOS transistor having its gate grounded so that the uppermost transistor 92 forms a substantially fixed biasing impedance between the supply voltage $V_{CC}$ and the second transistor 94. The second and third transistors 94, 96 are a PMOS transistor and an NMOS transistor in an inverter configuration, where the gates of both transistors 94, 96 are directly coupled to the output node 52. A control node 98 between the transistors 94, 96 forms the output of the voltage detection circuit 86 and supplies the control voltage $V_{CON}$ to the gate of the boost transistor 90. The NMOS transistor 96 has a much lower channel resistance than the series combination of the PiNfOS transistors 92, 94. This allows the NMOS transistor 96 to quickly pull the control voltage $V_{CON}$ low, as will be described below. Operation of the circuit of FIG. 5 will now be explained with reference to the signal timing diagrams of FIG. 6.

Figure 6:
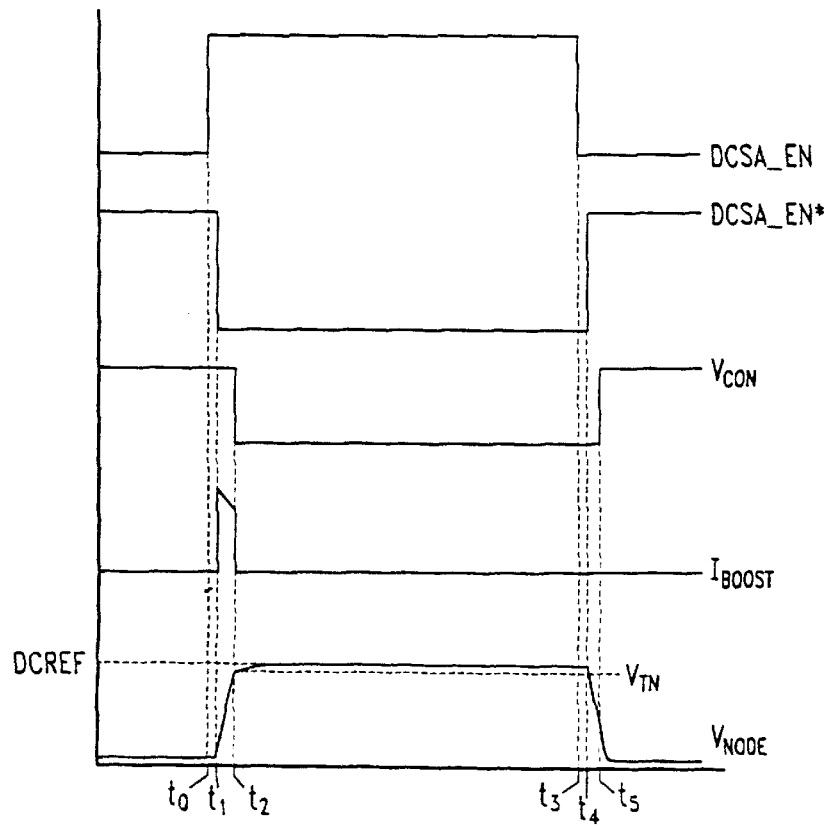
FIG. 6 is a signal timing diagram of voltages and currents in the circuit of FIG. 5.

As shown in the uppermost graph of FIG. 6, the enable signal DCSA_EN goes high at time $t_0$, thereby causing the inverter 42 to output a low inverted enable signal DCSA_EN* shortly thereafter at time $t_1$. In response to the inverted enable signal DCSA_EN*, the reset transistor 44 turns OFF, isolating the output node 52 from ground. Additionally, the low inverted enable signal DCSA_EN* turns ON the activation transistor 48, coupling the supply node 84 to the supply voltage $V_{CC}$. In response, the dropping transistor 50 turns ON, because the voltage of the supply node 84 is high and the gate voltage (i.e., the output voltage $V_{NODE}$) is still low. The reference transistor 54 is OFF, because its gate voltage (also the output voltage $V_{NODE}$) is also low. Consequently, a current $I_1$ flows from the supply node 84 to the output node 52 through the dropping transistor 50. At this point, the output node voltage $V_{NODE}$ has not yet risen above the threshold voltages of the transistors 94, 96 in the voltage detection circuit 86. Consequently, the PMOS transistors 92, 94 are ON and the NMOS transistor 96 is OFF. The ON PMOS transistors 92, 94 hold the control voltage $V_{CON}$ high, as shown in the third graph of FIG. 5, thereby holding the boost transistor 90 ON during the time between $t_1$ and $t_2$. The boost transistor 90 couples the supply node 84 directly to the output node 52, and as shown in the fourth graph of FIG. 6, thereby providing a boost current $I_{BOOST}$ to the output node 52.

Together, the currents $I_1$, $I_{BOOST}$ quickly raise the output voltage $V_{NODE}$ toward the reference voltage DCREF, as shown between times $t_1$ and $t_2$ in the fifth graph of FIG. 5. At time $t_2$ the output voltage $V_{NODE}$ turns ON the NMOS transistor 96 and turns OFF the lower PMOS transistor 94. The ON NMOS transistor 96 pulls the control voltage $V_{CON}$ low, thereby turning OFF the boost transistor 90 at time $t_2$, in response to the rising output voltage $V_{NODE}$.

After time $t_2$, the output voltage $V_{NODE}$ continues to rise to the desired reference voltage DCREF desired level as current continues to flow through the dropping transistor 50, until the output voltage $V_{NODE}$ reaches a stable point (DCREF) determined by the characteristics of the dropping transistor 50 and the reference transistor 54. One skilled in the art will recognize that the circuit 90 of FIG. 5 reduces time for the output voltage $V_{NODE}$ to reach substantially the reference voltage DCREF, as compared to the circuit 40 of FIG. 2. Also, the response time will be improved regardless of the capacitance C of the load circuit 56, because the duration of the boost current $I_{BOOST}$ is controlled by the output voltage $V_{NODE}$, not by the fixed time period $\tau$ of the circuit 60 of FIG. 3. Consequently, the time to prepare the boost amplifiers 20 (FIG. 1) for reading is reduced consistently for all expected capacitances C.

The output voltage $V_{NODE}$ remains at the reference voltage DCREF until the boost amplifiers 20 are disabled by the enable signal DCSA_EN falling at time $t_3$. At time $t_4$, shortly after the enable signal DCSA_EN falls, the inverted enable signal DCSA_EN* rises to turn OFF the activation transistor 48 and turn ON the reset transistor 44. The reset transistor 44 quickly pulls the output node 52 to ground by time $t_5$. When the output voltage $V_{NODE}$ falls below the threshold voltages $V_\tau$ of the transistors 94, 96, the lower PMOS transistor 94 turns ON and the NNMOS transistor 96 turns OFF at time $t_5$. The control voltage $V_{CON}$ rises and turns ON the boost transistor 90 to prepare for a subsequent transition of the enable signal DCSA_EN. However, since the PMOS transistor 48 was turned OFF by DCSA_EN* going high, no current flows through the boost transistor 90 after it turns ON.

Figure 7:
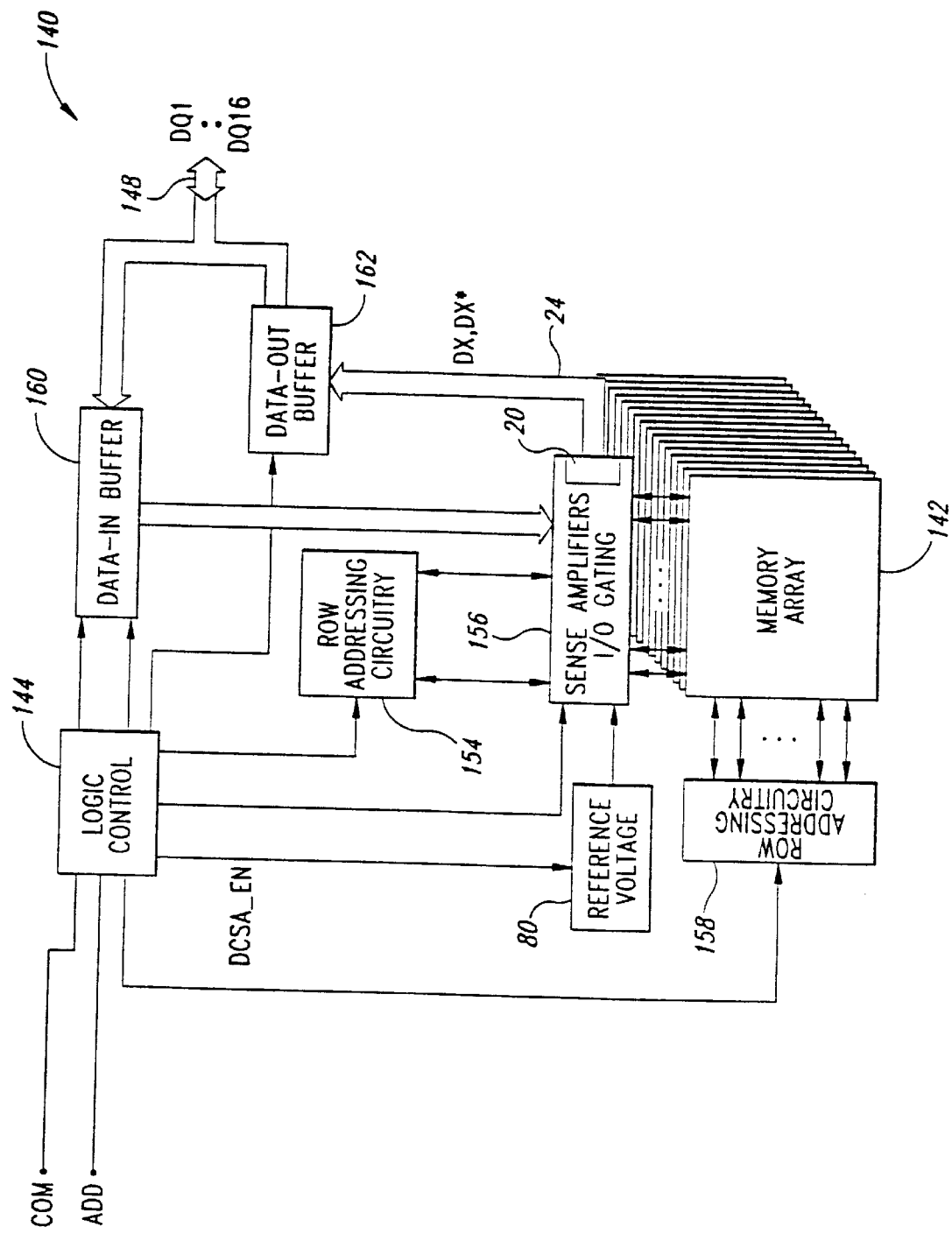
FIG. 7 is a block diagram of a memory device including the reference voltage circuit of FIG. 4.

As shown in FIG. 7, one embodiment of a memory device 140 according to the invention includes the reference voltage circuit 80 of FIG. 4. The memory device 140 includes as its central storage element a memory array 142 that may include one or more banks. The memory device 140 operates under control of a logic control circuit 144 that receives commands that control reading from and writing to the memory device 140. Where the device 140 is a conventional synchronous or asynchronous DRAM, the logic controller unit 144 is a conventional control logic and the commands may be command signals such as a write enable signal WE, a column address strobe signal $\overline{CAS}$, a row address strobe signal $\overline{RAS}$ and an output enable signal $\overline{OE}$. The overbars for the strobe signals $\overline{CAS}$ and $\overline{RAS}$ and output enable signal $\overline{OE}$ indicate that these signals are low-true signals, i.e., the strobe signals $\overline{CAS}$, $\overline{RAS}$ and output enable signal $\overline{OE}$ go to a low logic level when true. Where the device 140 is a packetized memory, the logic control circuit 144 may be a command sequencer and decoder and the commands may be control data in a packet.

In addition to the commands the memory device 140 also receives addresses ADD from an external source such as a memory controller. The addresses ADD may be provided on a separate address bus or may be part of a control data packet. The memory device 140 additionally receives and outputs data on a data bus 148.

Received column addresses are forwarded to column addressing circuitry 154 that provides decoded addresses to an I/O interface 156. The I/O interface 156 includes conventional I/O elements, including column select circuitry, sense amplifiers, precharge and equilibration circuitry, and the boosting amplifiers 20. Received row addresses are forwarded to row addressing circuitry 158 that activates a corresponding row of the memory array 142 in response.

If the logic control circuitry 144 determines that an operation is a read operation, the logic control circuitry 144 activates the precharge and equilibration circuitry and the sense amplifiers coupled to column lines of the array 142 to read data D, D* from the location identified by the decoded address. The logic control circuitry 144 also transmits the enable signal DCSA_EN to the reference voltage circuit 80. In response, the reference voltage circuit 80 provides the reference voltage DCREF to the boosting amplifiers 20 as described above, thereby preparing the amplifiers 20 to respond to the data D, D*. Column select circuitry transfers the data D, D* from the array 142 to the data lines 22 and the boosting amplifiers 20 output the boosted data DX, DX* in response. The boosted data DX, DX* is then provided to an output data buffer 162 and made available on the data bus 148.

Figure 8:
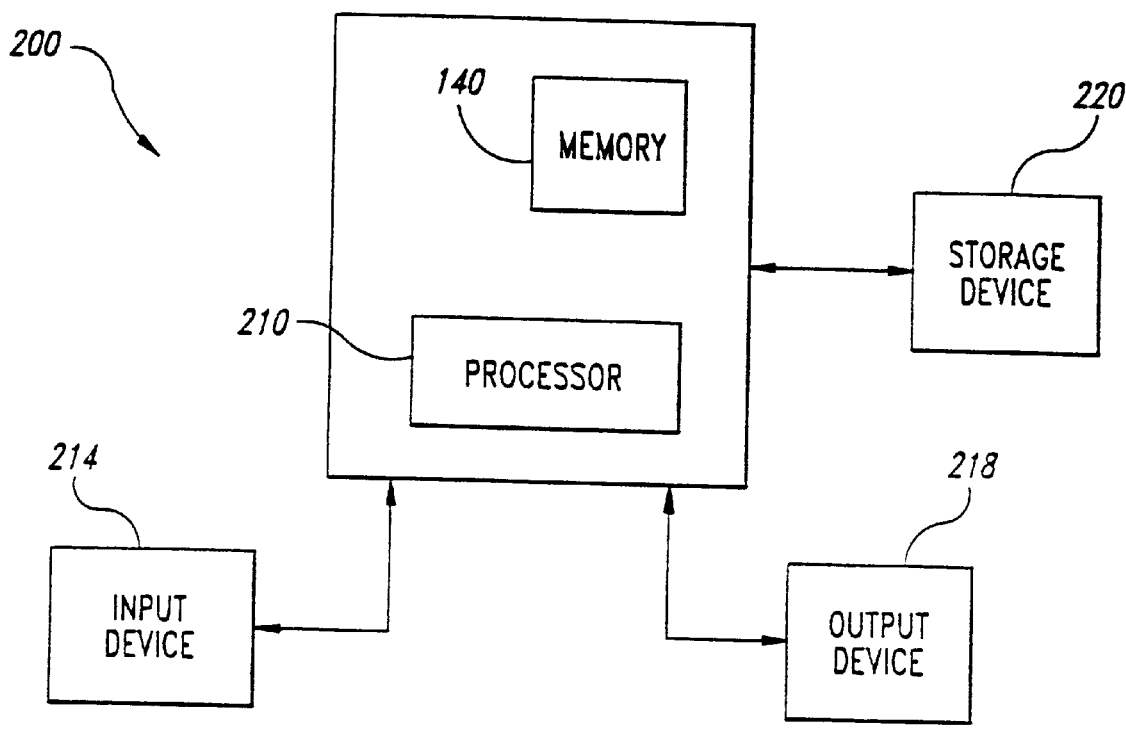
FIG. 8 is a is block diagram of a computer system incorporating the memory device of FIG. 7.

FIG. 8 is a block diagram of a computer system 200 that uses the memory device 140 including the reference voltage circuit 80. The computer system 200 includes a processor 210 for performing computer functions, such as executing software to perform desired calculations and tasks. One or more input devices 214, such as a keypad or a mouse, are coupled to the processor 210 and allow an operator (not shown) to manually input data thereto. One or more output devices 218 are coupled to the processor 210 to provide to the operator data generated by the processor 210. Examples of output devices 218 include a printer and a video display unit. One or more mass data storage devices 220 are preferably coupled to the processor 210 to store data in or retrieve data from the storage device 220. Examples of the storage devices 220 include disk drives and compact disk read-only memories (CD-ROMs).

While the invention has been presented herein by way of exemplary embodiments, various modifications may be made without departing from the spirit and scope of the invention. For example, the boost transistor 90 may be coupled to the supply voltage through a separate transistor, rather than through the activation transistor 48. Moreover, the boost circuit 82 may be combined with other boosting circuits such as the timed boost circuit 62 of FIG. 3. Additionally, other circuits may be implemented to provide boosting current $I_{BOOST}$ to the output node 52 in response to the detected output voltage DCREF. Further, the boost circuit 82 can be adapted easily to operate in an analog fashion rather than in the ON-OFF approach described herein to control the boost current $I_{BOOST}$. Also, a variety of other circuit structures may be adapted to establish the final output voltage with the assistance of the boost circuit 82. In addition, other circuit structures for producing a control signal for the boost circuit 82 in response to the detected output voltage DCREF can be developed by one skilled in the art. Further, one skilled in the art will recognized that the reference voltage circuit 80 may be formed using complementary voltages or devices. For example, the boost transistor 90 may be a PMOS device. In such an embodiment, the voltage detection circuit 86 would be modified to ground the gate of the boost transistor 90 until the output voltage $V_{NODE}$ approached the reference voltage DCREF. At that point, modified voltage detection circuit 86 would turn OFF the PMOS boost transistor 90 by raising the gate voltage to the supply voltages $V_{CC}$. One skilled in the art will understand that where the reference voltage circuit 80 is used to drive a PMOS-based circuit, the inactive state of the output voltage $V_{OUT}$ may be at or slightly below $V_{CC}$ rather than ground. In such an embodiment, the boost circuit 88 would shunt a boost current from the output node to ground until the voltage detector 86 determined that the output voltage $V_{NODE}$ fell below $V_{CC}$ by an appropriate amount. The primary reference voltage circuit then maintains the output voltage $V_{NODE}$ at ground potential. Accordingly, the invention is not limited except as by the appended claims.

I claim:

1. A method of producing a selected voltage at a node in response to an activation signal, the method comprising:

producing a primary current to charge or discharge the node responsive to the activation signal;

producing a boost current to supplement the primary current responsive to the activation signal;

monitoring a voltage of the node; and in response to the voltage of the node reaching a predetermined voltage, terminating the boost current.

2. The method of claim 1 further comprising sustaining the node voltage with the primary current after terminating the boost current.

3. The method of claim 1 wherein the predetermined voltage is less than the selected voltage.

4. The method of claim 1 wherein the predetermined voltage is greater than the selected voltage.

5. The method of claim 1 wherein the monitoring of a voltage of the node comprises comparing the voltage of the node to the predetermined voltage.

6. The method of claim 1, further comprising producing a switching signal in response to the voltage of the node exceeding the predetermined voltage, and wherein terminating the boost current comprises opening a switch in response to the switching signal.

7. The method of claim 1 wherein providing a primary charging current to the node comprises:

providing a command signal commanding production of the selected voltage; and in response to the command signal, initiating the providing of the primary charging current to charge the node.

8. The method of claim 7 wherein the providing of the primary charging current to charge the node is initiated by closing a switch coupled between a voltage source and the node.

9. A method of producing a selected voltage at an output node in response to an activation signal, the method comprising:

closing a first switch coupled between a first supply voltage and the output node and opening a second switch coupled between a second supply voltage and the output node in response to the activation signal;

closing a third switch coupled between the first supply voltage and the output node in response to the activation signal for the duration of a control signal;

sensing the voltage of the output node;

generating the control signal until the sensed voltage reaches a predetermined value; and closing the second switch and opening the first switch in the absence of the activation signal.

10. The method of claim 9 wherein the first switch comprises a pair of switches connected in series with each other between the first supply voltage and the output node.

11. The method of claim 10 wherein the pair of switches comprise a pair of PMOS transistors.

12. The method of claim 10 wherein the third switch is coupled to the first supply voltage through one of the switches in the pair of which the first switch is comprised.

13. The method of claim 10 wherein the second supply voltage comprises ground potential.

14. The method of claim 9 wherein the sensing of the voltage of the output node comprises comparing the voltage at the output node to the magnitude of the first supply voltage, and wherein the generating of the control signal comprises generating the control signal until the voltage of the output node is within a predetermined range of the magnitude of the first supply voltage.

15. A method of producing a selected voltage at an output node in response to an activation signal, the method comprising:

closing a first switch coupled between a supply voltage and a first node in response to the activation signal;

closing a second switch coupled between the first node and the output node in response to the activation signal;

opening a third switch coupled between the output node and ground potential in response to the activation signal;

closing a fourth switch coupled between the first node and the output node in response to a control signal;

sensing the voltage of the output node;

generating the control signal until the sensed voltage reaches a predetermined value;

opening the first and second switches in the absence of the activation signal; and closing the third switch in the absence of the activation signal.

16. The method of claim 15 wherein the switches each comprise a respective transistor.

17. The method of claim 15 wherein the sensing of the voltage of the output node comprises comparing the voltage at the output node to the magnitude of the supply voltage, and wherein the generating of the control signal comprises generating the control signal until the voltage of the output node is within a predetermined range of the magnitude of the supply voltage.

18. A method of producing a selected voltage at an output node in response to an activation signal, the method comprising:

closing a first switch coupled between a supply voltage and a first node in response to the activation signal;

coupling a first diode between the first node and the output node;

coupling a second diode between the output node and ground potential;

closing a second switch coupled between the first node and the output node in response to a control signal;

opening a third switch coupled between the output node and ground potential in response to the activation signal;

sensing the voltage of the output node;

generating the control signal until the sensed voltage reaches a predetermined value; and opening the first switch and closing the third switch in the absence of the activation signal.

19. The method of claim 18 wherein the first and second diodes comprise diode-connected field effect transistors.

20. The method of claim 19 wherein the first diode comprises a diode-connected PMOS transistor and the second diode comprises a diode-connected NMOS transistor.

21. The method of claim 18 wherein the switches each comprise a respective transistor.

22. The method of claim 18 wherein the sensing of the voltage of the output node comprises comparing the voltage at the output node to the magnitude of the supply voltage, and wherein the generating of the control signal comprises generating the control signal until the voltage of the output node is within a predetermined range of the magnitude of the supply voltage.

* * * * *